United States Patent [19]

Hulderman et al.

[11] 4,075,571
[45] Feb. 21, 1978

[54] EXTERNALLY BIASED VIDEO DETECTOR CIRCUIT FOR LIMITING CLUTTER AND NOISE IN A DETECTED RADAR SIGNAL

[75] Inventors: Garry N. Hulderman, Riverside; Jay B. Winderman, Claremont, both of Calif.

[73] Assignee: General Dynamics Corporation, Pomona, Calif.

[21] Appl. No.: 804,671

[22] Filed: June 8, 1977

[51] Int. Cl.² ........................ H03K 9/00; H03K 19/12
[52] U.S. Cl. .................................... 329/104; 307/232; 307/317 R; 329/205 R; 329/206
[58] Field of Search .................. 329/203, 205 R, 206, 329/104, 107; 307/232, 317 R; 325/323, 321, 373; 343/5 R

[56] References Cited

U.S. PATENT DOCUMENTS

| 3,519,943 | 7/1970 | Gassmann | 329/104 X |
|---|---|---|---|
| 3,593,171 | 7/1971 | Gassmann | 329/104 X |
| 3,603,988 | 9/1971 | Johnson | 343/5 R |

*Primary Examiner*—Siegfried H. Grimm

*Attorney, Agent, or Firm*—Neil F. Martin; Edward B. Johnson

[57] ABSTRACT

A video detector circuit for a radar system, including a detector diode having one of its electrodes connected to an input terminal for detecting an applied signal containing target information, rms noise voltage and components that are representative of clutter, and its other electrode connected to a load terminal for providing a detected signal; and a load resistance connected between the load terminal and a bias terminal; wherein a dc potential is provided at the bias terminal to forward bias the detector diode to have a quiescent operating point below the midpoint of the knee portion of its characteristic curve, thereby limiting diode rms noise current and components in the detected signal that are representative of clutter. As a result both the signal-to-noise ratio and the target-to-clutter ratio of the video detector circuit are enhanced. A filter network is connected between the load terminal and an output terminal for providing an output signal at the output terminal in which low frequency components representative of clutter in the detected signal are suppressed.

4 Claims, 10 Drawing Figures

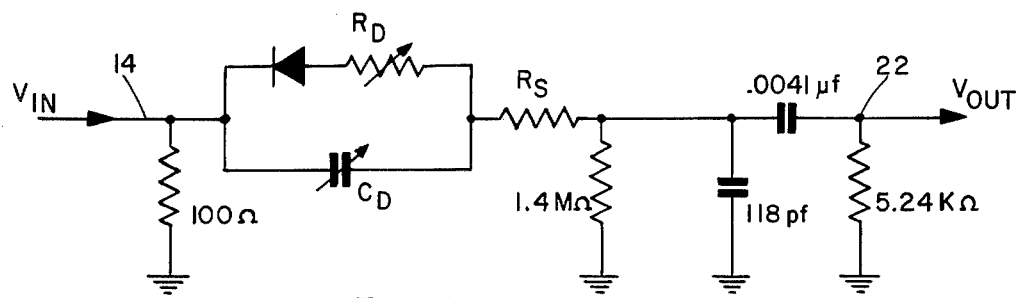
Fig. 6
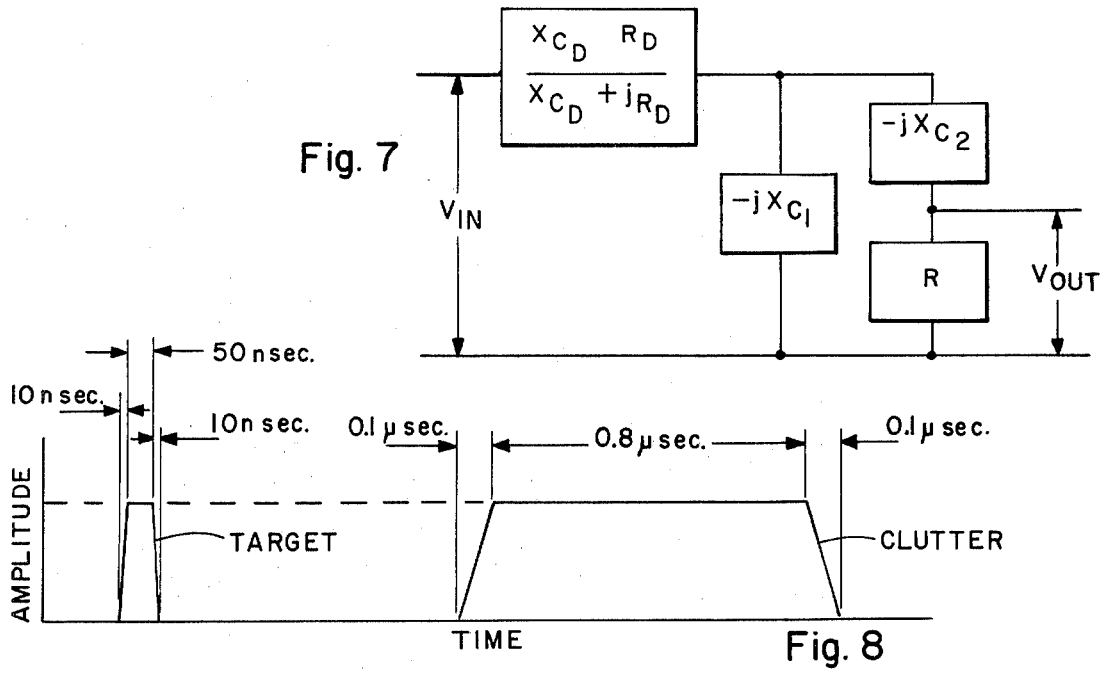
Fig. 7
Fig. 8
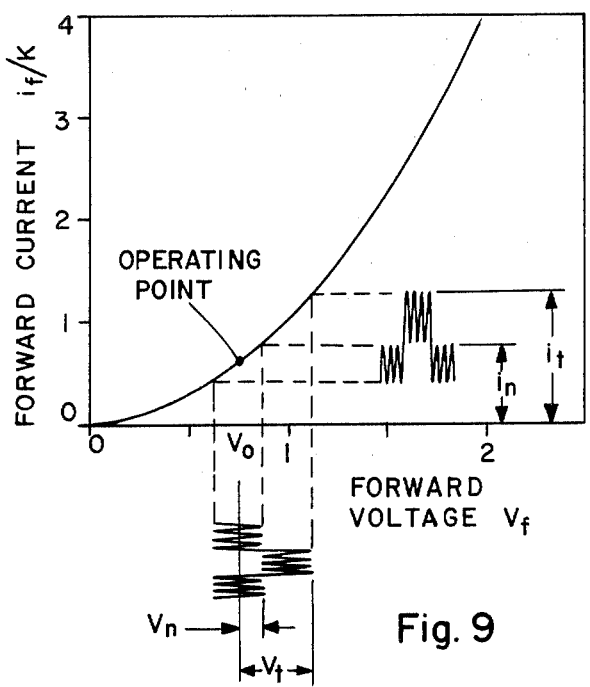
Fig. 9
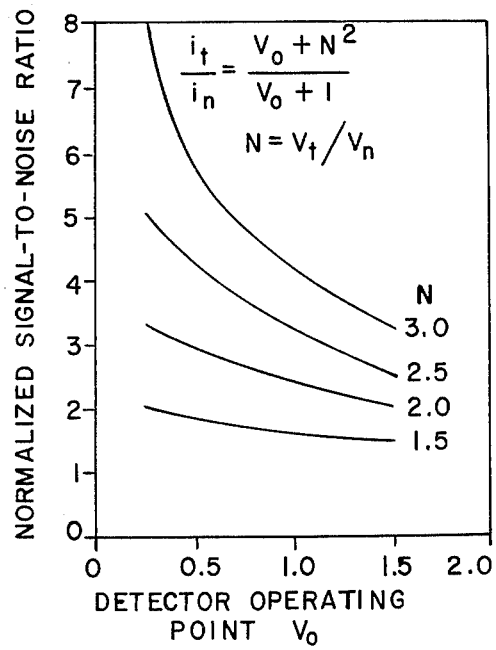
Fig. 10

EXTERNALLY BIASED VIDEO DETECTOR CIRCUIT FOR LIMITING CLUTTER AND NOISE IN A DETECTED RADAR SIGNAL

BACKGROUND OF THE INVENTION

The present invention generally pertains to video detector circuits for radar systems and is particularly directed to enhancing the signal-to-noise ratio and target-to-clutter ratio in a received radar signal prior to signal processing.

A typical video detector circuit essentially includes a detector diode having one of its electrodes connected to an input terminal for detecting an applied RF signal, and its other electrode connected to a load terminal for providing a detected signal; and a load resistance connected between the load terminal and a bias terminal. The operating characteristics of the diode are defined by a curve having a gradual portion in which the diode forward current increases slightly as the diode forward voltage is increased from zero volts, a steep portion in which the diode forward current increases sharply as the diode forward voltage is further increased, and a knee portion defining a transition between the gradual and steep portions. A typical characteristic curve for a diode is shown in FIG. 1.

The applied RF signal typically contains an rms voltage caused by thermal noise and components representative of clutter in addition to target information. Clutter is a term used to describe confusing and unwanted echoes which interfere with detection of the desired target information. Typically clutter may be caused by the ground and by trees, brush and other ground vegetation. The quiescent operating point of the detector diode serves as a dc pedestal level for the target, clutter and thermal noise voltage components which are contained in the applied RF signal.

Typically the bias terminal is at circuit ground potential; and the quiescent operating point of the detector diode is determined by the extent to which the diode is forward biased by the energy content of the applied RF signal. Such a video detector circuit is said to be self-biased. In a self-biased video detector circuit the quiescent operating point of the detector diode is in the steep portion of its characteristic curve. Accordingly when an applied signal which contains an rms noise voltage within a predetermined range is provided across the diode detector in a self-biased video detector circuit, the resultant diode rms noise current is in a range about the quiescent operating point in the steep portion of the characteristic curve, thereby causing the signal-to-noise ratio of the detected signal to be close in value to the signal-to-noise ratio of the applied signal.

SUMMARY OF THE INVENTION

The video detector circuit of the present invention is characterized by providing a dc potential at the bias terminal to forward bias the detector diode to have a quiescent operating point below the midpoint of the knee portion of its characteristic curve, thereby limiting diode rms noise current and components in said detected signal that are representative of clutter. Such a video detector circuit is said to be externally biased. As is explained hereinafter in the Operation and Theory of the Invention portion of the Specification, the limitation of noise and clutter by establishing the quiescent operating point of the detector diode at such point on its characteristic curve enhances the signal-to-noise ratio and the target-to-clutter ratio of the video detector circuit.

The externally biased video detector circuit of the present invention is further characterized by a filter network connected between the load terminal and an output terminal for providing an output signal at the output terminal in which low frequency components representative of clutter in the detected signal are suppressed.

BRIEF DESCRIPTION OF THE DRAWING

FIG. 6 is an equivalent circuit of the video detector circuit shown in FIG. 2.

FIG. 7 is an ac equivalent circuit of the video detector circuit of FIG. 2.

FIG. 8 illustrates waveform models of radar pulses representative of target and clutter.

FIG. 9 illustrates an ideal square law diode characteristic curve.

FIG. 10 illustrates curves of output signal-to-noise ratio versus detector diode quiescent operating point of an ideal square law diode for different input signal-to-noise ratios.

DESCRIPTION OF THE PREFERRED EMBODIMENT

Figure 2:
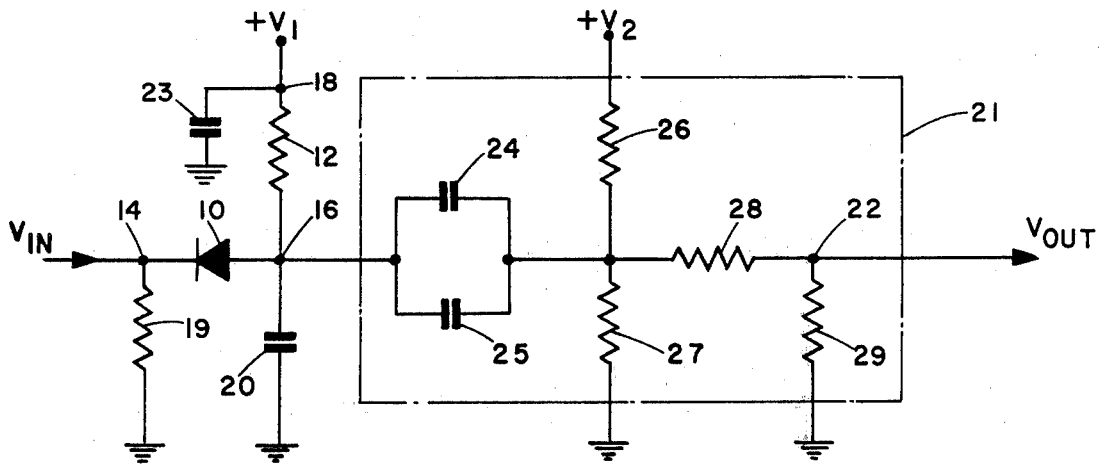
FIG. 2 is a schematic circuit diagram of an externally biased video detector circuit according to the present invention.

Referring to FIG. 2, a preferred embodiment of an externally biased diode detector circuit according to the present invention includes a detector diode 10 and a load resistance 12. The diode 10 has its cathode connected to an input terminal 14 and its anode connected to a load terminal 16. The load resistance 12 is connected between the load terminal 16 and a bias terminal 18. A resistance 19 connected between the input terminal 14 and circuit ground provides a dc return path for the diode 10.

The detector diode 10 is a Hewlett Packard No. 5082-2810 diode. The characteristic curve for this diode is shown in FIG. 1.

Figure 1:
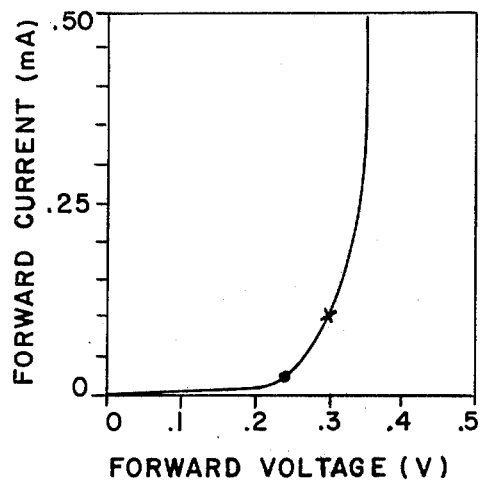
FIG. 1 illustrates a diode characteristic curve showing the relationship of forward current to forward voltage.

A positive dc potential $+V_1$ of 22 volts is provided at the bias terminal 18 to forward bias the diode 10 to have a quiescent operating point on its characteristic curve at the point indicated by the "o" symbol in FIG. 1. At this quiescent operating point the diode forward voltage is approximately 230 millivolts and the diode forward current is approximately 14 microamperes.

The detector diode 10 detects an applied RF signal at terminal 14 and provides a detected signal at terminal 16. The applied RF signal may include target, thermal noise and clutter components. The target components are radar pulses reflected from substantial solid objects. The rise time of a radar pulse representative of a target corresponds to a frequency component of approximately 100 MHz. The clutter components are radar pulses reflected from less substantial objects, such as bushes or foilage. The rise time of a radar pulse representative of clutter corresponds to a frequency of approximately 10 MHz.

The load resistor 12 in combination with the capacitor 20 forms a shunt RC network which functions to integrate the detected radar signal pulses provided at the load terminal 16.

Figure 3:
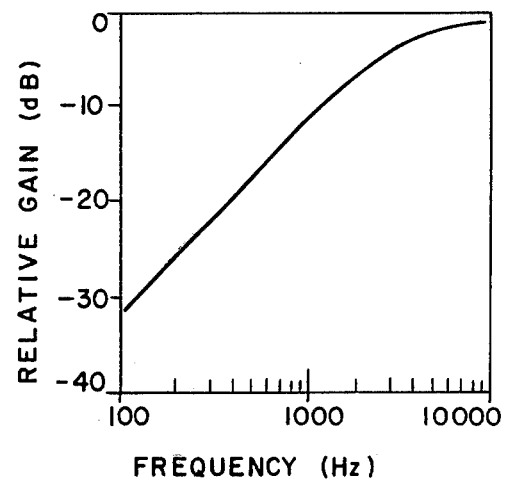
FIG. 3 is a curve showing the low frequency response of the high pass filter network included in the video detector circuit of FIG. 2.

A high pass filter 21 network is connected between the load terminal 16 and an output terminal 22. The high pass filter network 21 includes capacitors 24 and 25, and resistances 26, 27, 28, and 29. The high pass filter network 21 suppresses low frequency components representative of clutter that are included in the detected signal at terminal 16 so that such clutter components are suppressed in the output signal provided at terminal 22. The radar backscatter cross-section of moving clutter, such as vegetation, is a stochastic quantity containing frequency components to a few hundred hertz. The addition of the high pass filter network 21 to the video detector circuit serves to suppress the excursions of the frequency components about the means value of clutter. The low frequency response of the high pass filter network 21 is shown in FIG. 3. The 3 dB corner is at about 4KHz, and the attenuation slope is about 12 dB per octave.

The values of the resistances and capacitances used in the preferred embodiment of the externally biased video detector circuit shown in FIG. 2 are a follows:

| RESISTANCES | |
|---|---|
| 12 | 1.4 megohms |
| 19 | 100 ohms |
| 26 | 11 kilohms |
| 27 | 10 kilohms |
| 28 | 1 kilohm |
| 29 | 1 megohm |
| CAPACITANCES | |
| 20 | 118 pf |
| 23 | 1 μf |
| 24 | .0039 μf |
| 25 | 220 pf |

OPERATION AND THEORY OF THE INVENTION

The operation and theory of the externally biased video detector circuit of the present invention is explained with reference to the preferred embodiment thereof described above with reference to FIG. 2.

1. Enhancement of Target-to-Clutter Ratio

The detector diode 10 operates at the quiescent operating point "o" on its characteristic curve, as shown in FIG. 1. When a radar pulse in the RF signal applied at the input terminal 14 is detected by the diode 10, the diode is reverse biased, thereby resulting in a displacement of the operating point to some peak value.

The magnitude of the displacement of the operating point from its quiescent value is a function of the energy content of the radar pulse. If the energy content is large, the displacement will be more pronounced. Radar pulses representative of a target usually are narrow, such as 70 nanoseconds wide, for example. Extended ground clutter, however, is received from the entire area of intersection between the antenna beam and the ground. Thus the pulse widths of radar pulse representative of clutter usually are large, such as 1 microsecond, for example. Consequently, ground clutter, which is of the same order of magnitude as the target, will cause a much larger displacement of the operating point than will the target.

Figure 4:
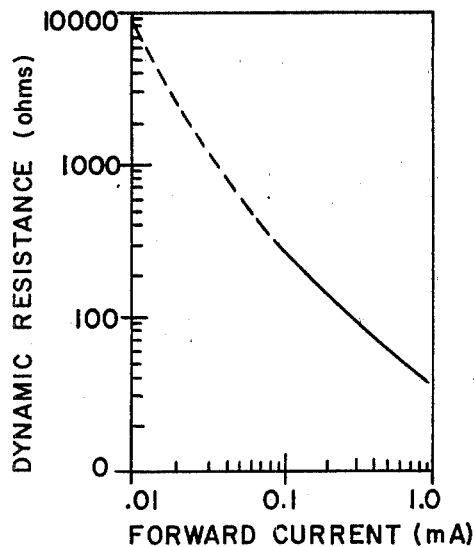
FIG. 4 is a characteristic curve of the junction resistance for the diode used in the preferred embodiment of the video detector circuit of FIG. 2.
Figure 5:
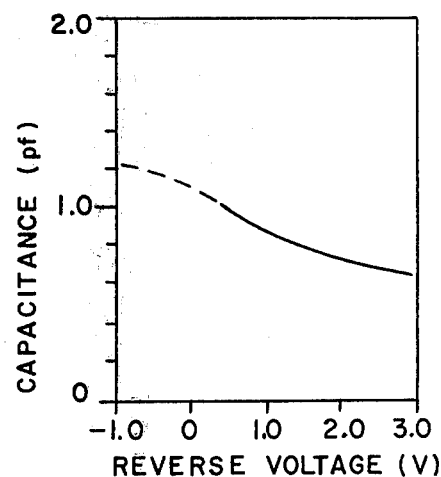
FIG. 5 is a characteristic curve of the junction capacitance for the diode used in the preferred embodiment of the video detector circuit of FIG. 2.

The displacement of the operating point of the detector diode 10 from its quiescent value results in changes in the diode junction resistance. The junction capacitance changes very little, remaining at about 1.1 pf. as shown in the characteristic curve for junction capacitance (FIG. 5). But the variation in junction resistance, as shown in the characteristic curve for junction resistance (FIG. 4), is a sensitive function of forward diode current. When the diode 10 is reverse biased by the applied signal, its forward current decreases, and its junction resistance increases.

FIG. 6 shows the equivalent circuit of the externally-biased video detector circuit of FIG. 2. The diode 10 can be represented by a combination of an ideal diode, a capacitor $C_D$, and two resistors $R_D$ and $R_S$ as shown in FIG. 6. The effect of an increase in junction resistance is a greater influence by the junction capacitance on the impedance of the combined elements. The capacitive reactance, for its part, is a function of the frequency components of the input waveforms, and it will be higher for the radar pulse representative of clutter than for the radar pulse, representative of a target. This is because the rise time of the clutter pulse is longer than the rise time of the target pulse. It now will be shown, by example, that changing the diode impedance by the means described will result in an increased target-to-clutter ratio. Example.

FIG. 7 is the ac equivalent video detector circuit, shown in terms of resistances and capacitive reactances. Its transfer function can be shown to equal:

$$\frac{V_{out}}{V_{in}} = \frac{[R_L^2 X_{C_D} + R_L R_D (X_{C_1} + X_{C_2})]}{[R_L^2 X_{C_D} + R_L R_D (X_{C_1} + X_{C_2}) + R_D X_{C_D} X_{C_1} X_{C_2}]} \quad (1)$$

$$\frac{+ j[R_L^2 R_D - R_L X_{C_D}(X_{C_1} + X_{C_2})]}{+ j[R_L^2 R_D - R_L X_{C_D}(X_{C_1} + X_{C_2}) - R_L R_D X_{C_D} X_{C_1}]}$$

In FIG. 7, the 1.4 megohm resistor has been omitted because its effect is insignificant. For the same reason, the diode series resistance, which is only about 10 ohms, has been omitted. Input waveform models of radar pulses representative of target and clutter are shown in FIG. 8. They are approximations to the actual values, but their amplitudes have been normalized to unity. The rise time of the target pulse is 10 nanoseconds, so that its frequency response is 100 MHz. The rise time of the clutter pulse is 100 nanoseconds, equivalent to a frequency of 10 MHz. The differences in rise times account for the differences, by a factor of 10, in the values of the reactive components when confronted by a target or clutter.

The values of all the circuit components of the ac equivalent circuit of FIG. 7 are as follows:

| | Operating Point (mA) | | Reactances | | Resistances | |
|---|---|---|---|---|---|---|
| Input | Quiescent | Peak | $X_{C_D}$ | $X_{C_2}$ | $R_D$ | R |
| Target | .05 | | 1590 | 13.5 | .4 | 680 | 5240 |
| Target | | .01 | 1590 | 13.5 | .4 | 8000 | 5240 |

-continued

| Input | Operating Point (mA) | | Reactances | | Resistances | |
|---|---|---|---|---|---|---|
| | Quiescent | Peak | $X_{C_D}$ | $X_{C_2}$ | $R_D$ | $R$ |
| Clutter | .05 | | 1590 | 135 4 | 680 | 5240 |
| Clutter | | .01 | 15900 | 135 4 | 8000 | 5240 |

These values were substituted into equation (1) to compute the relative gains of the circuit to target and clutter components for quiescent and peak values of detector bias. These gains are as follows:

| Waveform | Condition | $V_o/V_i$ | Attenuation |
|---|---|---|---|
| Target | Quiescent | 65 | −5.9 dB |
| Target | Peak | .33 | |
| Clutter | Quiescent | .063 | −21.3 dB |
| Clutter | Peak | .0054 | |

It is seen that target amplitude decreases by 5.9 dB, whereas clutter amplitude is reduced by 21.3 dB. The improvement in target-to-clutter ratio, therefore, is 15.4 dB.

2. Signal-to-Noise Ratio Enhancement

A typical quiescent operating point of a detector diode, such as the diode 10, in a self-biased video detector circuit is indicated by the "x" symbol on the diode characteristic curve of FIG. 1. It is situated on the steep portion of the curve, and therefore, any applied rms noise voltage produces a moderately large rms noise current. Lowering the quiescent operating point by externally biasing the video detector circuit in accordance with the present invention, as shown by the "o" symbol on the curve of FIG. 1, results in a smaller rms noise current range for the same rms noise voltage as is applied to the self-biased video detector circuit. If the quiescent operating point is lowered sufficiently, clipping of negative-going (relative to the pedestal) rms noise voltage by the action of the diode 10 produces an additional reduction in the noise current.

In the externally-biased video detector circuit of the present invention, the components in the detected signal representative of target information will be reduced in amplitude along with the noise components. However, as long as the amplitude of the target components exceeds the amplitude of the noise components, the attenuation of the target components will be less, thereby resulting in an increased signal-to-noise ratio. Optimization of this ratio requires the correct selection of the quiescent operating point. If the operating point is too low, the output ratio can be very small for small input ratio. If it is too high, the level of output noise becomes unacceptable. Example.

In illustrating how lowering the quiescent operating point increases signal-to-noise ratio, a square law detector diode is assumed. The square law characteristic of an ideal square law diode is:

$$i = kv^2, \quad (2)$$

as shown in FIG. 9. The quantity $k$ is a constant. Letting $V_o + V_t$ be the input target voltage, and $V_o + V_n$ be the input noise voltage, the output signal-to-noise ratio, referenced to ground, can be written as:

$$\frac{i_t}{i_n} = \left( \frac{V_o + V_t}{V_o + V_n} \right)^2. \quad (3)$$

Let $N = V_t/V_n$, where $N > 1$, so that $$\frac{i_t}{i_n} = \left( \frac{V_o + NV_n}{V_o + V_n} \right)^2 \quad (4)$$

To assist in the illustration, let $V_n = 1$. Then, $$\frac{i_t}{i_n} = \left( \frac{V_o + N}{V_o + 1} \right)^2. \quad (5)$$

The output signal-to-noise ratio is graphed in FIG. 10 as a function of detector quiescent operating point, for a number of input signal-to-noise ratios. It is seen, as an example, when $N = 2.0$, that moving the operating point from 1.0 to 0.25 increases the output signal-to-noise ratio by a factor of 1.4, which is 3.2 dB. The improvement has been achieved at the expense of decreased system gain, for which external compensation is a simple remedy. The decrease in gain is equal to $$\left( \frac{V_{02} + N}{V_{01} + N} \right)^2$$

which, for the numerical example, is 5 dB.

For optimum improvement in signal-to-noise ratio, the quiescent operating point should be at a voltage such that the rms noise current range corresponding to a predetermined rms noise voltage does not significantly protrude above the knee of the curve.

3. Conclusion

Proper external biasing of a video detector diode 10 results in increased signal-to-noise and target-to-clutter ratios over those which are obtained using a self-biasing arrangement. Back biasing the detector diode 10 by applied RF signals with a large energy content causes significant clutter component suppression but only slight reduction in the amplitude of strong target components in such signals. The addition of the high-pass filter network 21 following the diode detector 10 provides additional clutter reduction by suppressing low frequency components representative of clutter.

Having described out invention, we now claim:

1. A video detector circuit for a radar system, comprising, a detector diode having one of its electrodes connected to an input terminal for detecting an applied signal containing target information, rms noise voltage and components that are representative of clutter, and its other electrode connected to a load terminal for providing a detected signal, wherein the operating characteristics of the diode are defined by a curve having a gradual portion in which the diode forward current increases slightly as the diode forward voltage is increased from zero volts, a steep portion in which the diode forward current increases sharply as the diode forward voltage is further increased, and a knee portion defining a transition between the gradual and steep portions; and a load resistance connected between the load terminal and a bias terminal;

wherein the improvement comprises, means for providing a dc potential at the bias terminal to forward bias the detector diode to have a quiescent operating point below the midpoint of the knee portion of its said characteristic curve, thereby limiting diode rms noise current and components in said detected signal that are representative of clutter.

2. A video detector circuit according to claim 1, further comprising means connected between the load terminal and an output terminal for providing an output signal at said output terminal in which low frequency components representative of clutter in said detected signal are suppressed.

3. A video detector circuit according to claim 2, for detecting an applied signal which contains a predetermined rms noise voltage, wherein the detector diode is forward biased such that the diode rms noise current range does not significantly protrude above the knee portion of said characteristic curve.

4. A video detector circuit according to claim 1, for detecting an applied signal which contains a predetermined rms noise voltage, wherein the detector diode is forward biased such that the diode rms noise current range does not significantly protrude above the knee portion of said characteristic curve.

* * * * *